United States Patent
Chan et al.

(10) Patent No.: US 9,401,698 B1
(45) Date of Patent: Jul. 26, 2016

(54) TRANSFORMING A PHASE-LOCKED-LOOP GENERATED CHIP CLOCK SIGNAL TO A LOCAL CLOCK SIGNAL

(71) Applicant: INTERNATIONAL BUSINESS MACHINES CORPORATION, Armonk, NY (US)

(72) Inventors: Yuen Hung Chan, Poughkeepsie, NY (US); Juergen Pille, Boeblingen (DE); Rolf Sautter, Boeblingen (DE); Tobias Werner, Boeblingen (DE)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/716,992

(22) Filed: May 20, 2015

(51) Int. Cl.
*G11C 8/00* (2006.01)
*H03K 3/017* (2006.01)
*H03K 5/156* (2006.01)
*G11C 11/419* (2006.01)
*G11C 7/22* (2006.01)

(52) U.S. Cl.
CPC ............. *H03K 3/017* (2013.01); *G11C 7/222* (2013.01); *G11C 11/419* (2013.01); *H03K 5/156* (2013.01)

(58) Field of Classification Search
CPC ......... G11C 7/22; G11C 7/1072; G11C 7/222
USPC .................. 365/233.1, 233.11, 194
See application file for complete search history.

(56) References Cited

U.S. PATENT DOCUMENTS

| | | | |
|---|---|---|---|
| 5,708,578 A | 1/1998 | Stoddard et al. | |
| 6,996,026 B2 * | 2/2006 | Brox | G11C 7/22 365/189.15 |
| 7,936,198 B2 | 5/2011 | Sautter et al. | |
| 7,936,638 B2 | 5/2011 | Chan et al. | |
| 8,237,481 B2 | 8/2012 | Chan et al. | |
| 8,299,833 B2 | 10/2012 | Bunce et al. | |
| 2004/0135607 A1 | 7/2004 | Yee et al. | |
| 2013/0094272 A1 * | 4/2013 | Riho | G11C 11/4076 356/63 |
| 2014/0137070 A1 | 5/2014 | Dengler et al. | |

FOREIGN PATENT DOCUMENTS

JP 2014-194838 A 10/2014

OTHER PUBLICATIONS

Chan, Yuen Hung, "Transforming a Phase-Locked-Loop Generated Chip Clock Signal to a Local Clock Signal", U.S. Appl. No. 14/922,315, filed Oct. 26, 2015 (21 pages).

Chan, Yuen Hung, "Listing of IBM Patents and/or Patent Applications Treated as Related", U.S. Appl. No. 14/716,992, filed May 20, 2015, dated Mar. 8, 2016 (2 pages).

Chan, Yuen Hung, Office Action for U.S. Appl. No. 14/922,315, filed Oct. 26, 2015, dated May 10, 2016 (9 pages).

* cited by examiner

*Primary Examiner* — Son Dinh
(74) *Attorney, Agent, or Firm* — Damion Josephs, Esq.; Kevin P. Radigan, Esq.; Heslin Rothenberg Farley & Mesiti P.C.

(57) ABSTRACT

Electronic circuits and memory circuits are provided for implementing a method for transforming a chip clock signal to a local clock signal. The method includes: generating a first clock signal in response to the chip clock signal, a first control signal and a second control signal; generating a second clock signal by delaying the first clock signal with a second clock delay; generating the first control signal and the second control signal by delaying the second clock signal with a pulse width delay, where the first control signal goes from high-to-low with a control signal delay after the second control signal goes from high-to-low, and vice versa; and generating the local clock signal based on the second clock signal.

17 Claims, 7 Drawing Sheets

TRANSFORMING A PHASE-LOCKED-LOOP GENERATED CHIP CLOCK SIGNAL TO A LOCAL CLOCK SIGNAL

BACKGROUND

The present invention generally relates to pulse width modulation of an electronic signal, and more specifically, to a programmable circuit for pulse width modulation of a clock signal in an integrated circuit, for instance, for use in clocking an arrange such as static random-access memory (SRAM).

Integrated circuits are used for a diverse number of electronic applications, from simple devices such as wristwatches to the most complex computer systems. Integrated circuits rely on a variety of clock signals to ensure proper circuit performance, but timing closure is becoming more difficult with each technology node used for integrated circuit design, such as for the 65 nanometer semiconductor device fabrication node.

There is an additional challenge for the circuit designer in constructing clock circuits that use reduced power. Low power circuits are becoming more prevalent due to power consumption problems. In particular, power dissipation has become a limiting factor for the yield of high performance circuit designs (operating at frequencies around one gigahertz or more) fabricated in deep sub micrometer technologies. Clock nets can contribute up to 50% of the total active power in multi-GHz designs. Low power designs are also preferable, since they exhibit less power supply noise and provide better tolerance with regard to manufacturing variations.

A typical clock control system has a pulsed clock generation circuit (e.g., a phase-lock loop) that generates a master clock signal. The master clock signal is fed to a clock distribution network that renders synchronized global clock signals at clock distribution structures such as local clock buffers (LCBs). Each LCB adjusts the global clock duty cycle and edges to meet the requirements of respective circuit elements, for example, local logic circuits, latches or memory arrays. A significant timing component in the SRAM control is the local clock signal pulse width, which determines SRAM read and write time windows.

U.S. Pat. No. 7,936,638 B2 addresses the local clock signal pulse width and proposes an electrical circuit comprising an input line adapted to receive an input signal switching binary states, an output line providing an output signal switch binary states responsive to the input line, a plurality of programmable paths connecting the output line to ground connections, wherein the programmable paths provide different pull-down rates, and means for selecting a desired one of the programmable paths based on a plurality of encoded control signals without using a separable decoder circuit, the selecting means including decode logic integrated with said programmable paths.

As technology advances and approaches the 14 nanometer semiconductor device fabrication node, further improvement in pulse width control with reduced or minimum control overhead to save chip area and power would be desirable.

SUMMARY

According to one aspect, an electronic circuit is provided for use in memory array control circuitry to transform a chip clock signal to a local clock signal. The electronic circuit comprises: base control circuitry including a chip clock signal input for receiving the chip clock signal, a first control signal input for receiving a first control signal, a second control signal input for receiving a second control signal, a first clock signal output for transmitting a first clock signal, wherein the base control circuitry generates the first clock signal in response to the chip clock signal, the first control signal and the second control signal; delay control circuitry including a first clock signal input for receiving the first clock signal, a second clock signal output for transmitting a second clock signal, wherein the delay control circuitry generates the second clock signal by delaying the first clock signal with a second clock delay; pulse width control circuitry including a pulse width control second clock signal input for receiving the second clock signal, a first control signal output for transmitting the first control signal, a second control signal output for transmitting the second control signal, wherein the pulse width control circuitry generates the first control signal and the second control signal by delaying the second clock signal with a pulse width delay, wherein the first control signal goes from high to low with a control signal delay after the second control signal goes from high to low and vice versa; and driver circuitry including a driver second clock signal input for receiving the second clock signal and a local clock output for outputting the local clock signal, wherein the driver circuitry generates the local clock signal based on the second clock signal.

According to another aspect, a memory circuit is provided which comprises an SRAM array and at least one electronic circuit for transforming a chip clock signal to a local clock signal. The electronic circuit comprises, for instance: base control circuitry including a chip clock signal input for receiving the chip clock signal, a first control signal input for receiving a first control signal, a second control signal input for receiving a second control signal, a first clock signal output for transmitting a first clock signal, wherein the base control circuitry generates the first clock signal in response to the chip clock signal, the first control signal and the second control signal; delay control circuitry including a first clock signal input for receiving the first clock signal, a second clock signal output for transmitting a second clock signal, wherein the delay control circuitry generates the second clock signal by delaying the first clock signal with a second clock delay; pulse width control circuitry including a pulse width control second clock signal input for receiving the second clock signal, a first control signal output for transmitting the first control signal, a second control signal output for transmitting the second control signal, wherein the pulse width control circuitry generates the first control signal and the second control signal by delaying the second clock signal with a pulse width delay, wherein the first control signal goes from high to low with a control signal delay after the second control signal goes from high to low and vice versa; and driver circuitry including a driver second clock signal input for receiving the second clock signal and a local clock output for outputting the local clock signal, wherein the driver circuitry generates the local clock signal based on the second clock signal.

According to another aspect, a method is provided for transforming a chip clock signal to a local clock signal. The method includes, for instance: generating a first clock signal in response to the chip clock signal, a first control signal and a second control signal; generating a second clock signal by delaying the first clock signal with a second clock delay; generating the first control signal and the second control signal by delaying the second clock signal with a pulse width delay, wherein the first control signal goes from high to low with a control signal delay after the second control signal goes from high to low and vice versa; and generating the local clock signal based on said second clock signal.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

The present invention together with the above-mentioned and other objects and advantages may best be understood from the following detailed description of the embodiments, but not restricted to the embodiments, wherein.

DETAILED DESCRIPTION

The present invention may be better understood, and its numerous objects, features, and advantages made apparent to those skilled in the art by referencing the accompanying drawings.

Figure 1:
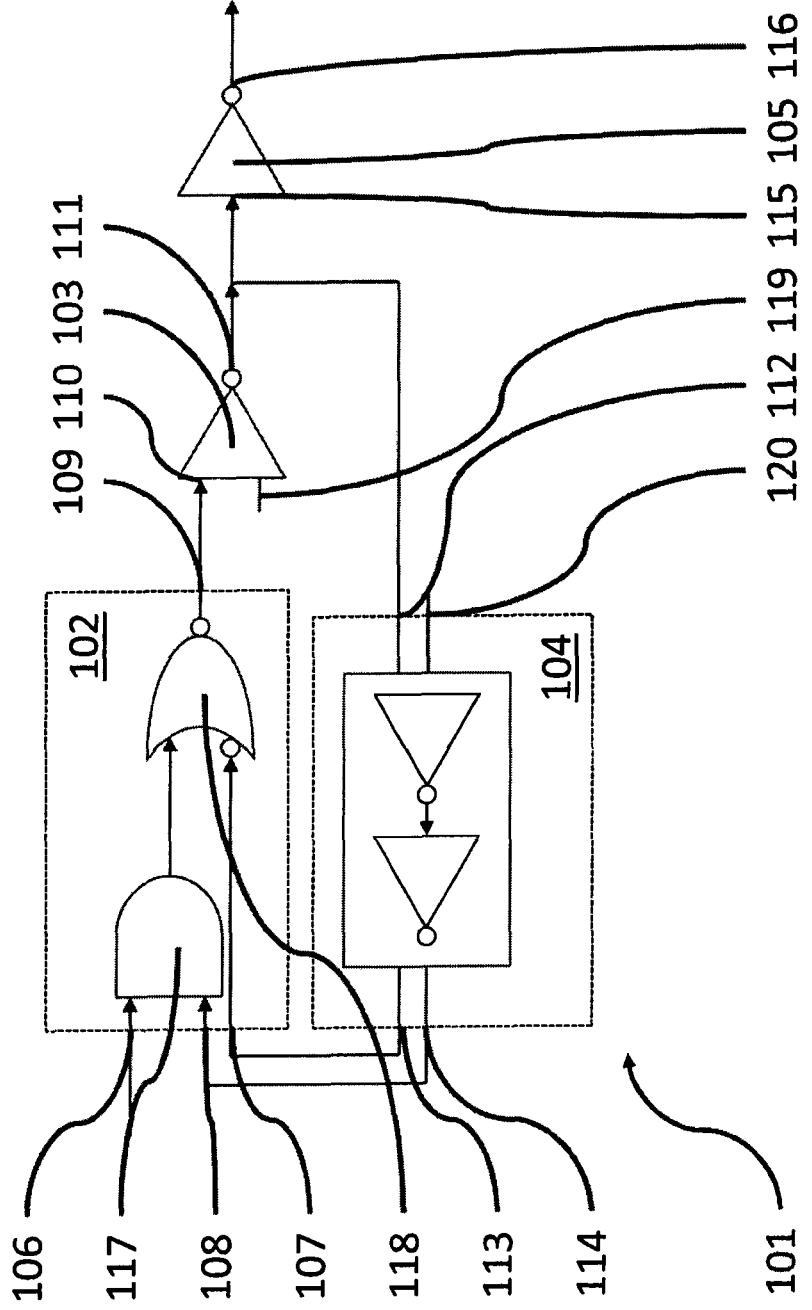
FIG. 1 is a gate-level diagram of an electronic circuit, in accordance with one or more aspects of the present invention.

FIG. 1 discloses an electronic circuit 101 for use in memory array control circuitry to transform a chip clock signal to a local clock signal in form of a gate level schematic diagram. The electronic circuit 101 comprises base control circuitry 102, delay control circuitry 103, pulse width control circuitry 104 and driver circuitry 105. The base control circuitry 102 includes a chip clock signal input 106, a first control signal input 107, a second control signal input 108 and a first clock signal output 109. The delay control circuitry 103 has a first clock signal input 110 and a second clock signal output 111. The pulse width control circuitry 104 comprises a second clock signal input 112, a first control signal output 113 and the driver circuitry 105 includes a driver second clock signal input 115 and a local clock output 116.

The electronic circuit 101 may receive a chip clock signal via the chip clock signal input 106 of its base control circuitry 102. In particular, the chip clock signal may be a phase-locked loop generated signal. The base control circuitry 102 generates the first clock signal in response to the chip clock signal and a first control signal as well as a second control signal, which are received via the first control signal input 106 and the second control signal in-put 107, respectively.

The delay control circuitry 103 further processes the first clock signal, which it receives via its first clock signal input 110, and transforms it to a second clock signal, which the delay control circuitry 103 transmits via its second clock signal output 111. In particular, the delay control circuitry 103 delays the second clock signal with respect to the first clock signal by a certain second clock delay.

The second clock signal is received by the pulse width control circuitry 104 and the driver circuitry 105 via the pulse width control second clock signal input 112 and the driver second clock signal input 115, respectively.

The pulse width control circuitry 104 adds a pulse width delay to the second clock signal and transmits the obtained signal as first control signal and second control signal via the first control signal output 113 and the second control signal output 114.

The first control signal goes from high to low with a control signal delay after the second control signal goes from high to low and vice versa. The control signal delay may be small in comparison to the second clock delay and the pulse width delay.

The base control circuitry 102 may further comprise an AND-gate 117 and a NOR-gate 118. The chip clock signal input 106 and the second control signal input 108 may be connected to the inputs of the AND-gate 117 and the output of the AND-gate 117 may be connected to one input of the NOR-gate 118. The first control signal input 107 may connected to the inverted other input of the NOR-gate 118.

Moreover, the delay control circuitry 103 may comprise a second clock delay input 119 for adjusting the second clock delay. The second clock delay input 119 may permit selecting from the three different second clock delays. For example, the second clock delay may be selected to be between one FO4 and ten FO4, in particular three FO4, four FO4 or five FO4. FO4, i.e. "Fan-out of 4", relates to a process-independent delay metric. As a delay metric, one FO4 is the delay of an inverter driven by an inverter four times smaller than itself, and driving an inverter four times larger than itself. Moreover, the other elements of the electronic circuit 101 may remain essentially the same.

Alternatively or in addition, the pulse width control circuitry 104 may comprise a pulse width delay input 120 for adjusting the pulse width delay. The pulse width delay in-put 120 may allow for the selection of one of four pulse width delay settings. For example, the pulse width delay may be selected to be between one FO4 and ten FO4, in particular, between six FO4 and seven FO4, which may translate to a pulse with delay of approximately 65 ps. Longer pulse width delays may improve array stress and screen test capabilities and, therefore, improve and/or ensure robust hard-ware quality.

Figure 2:
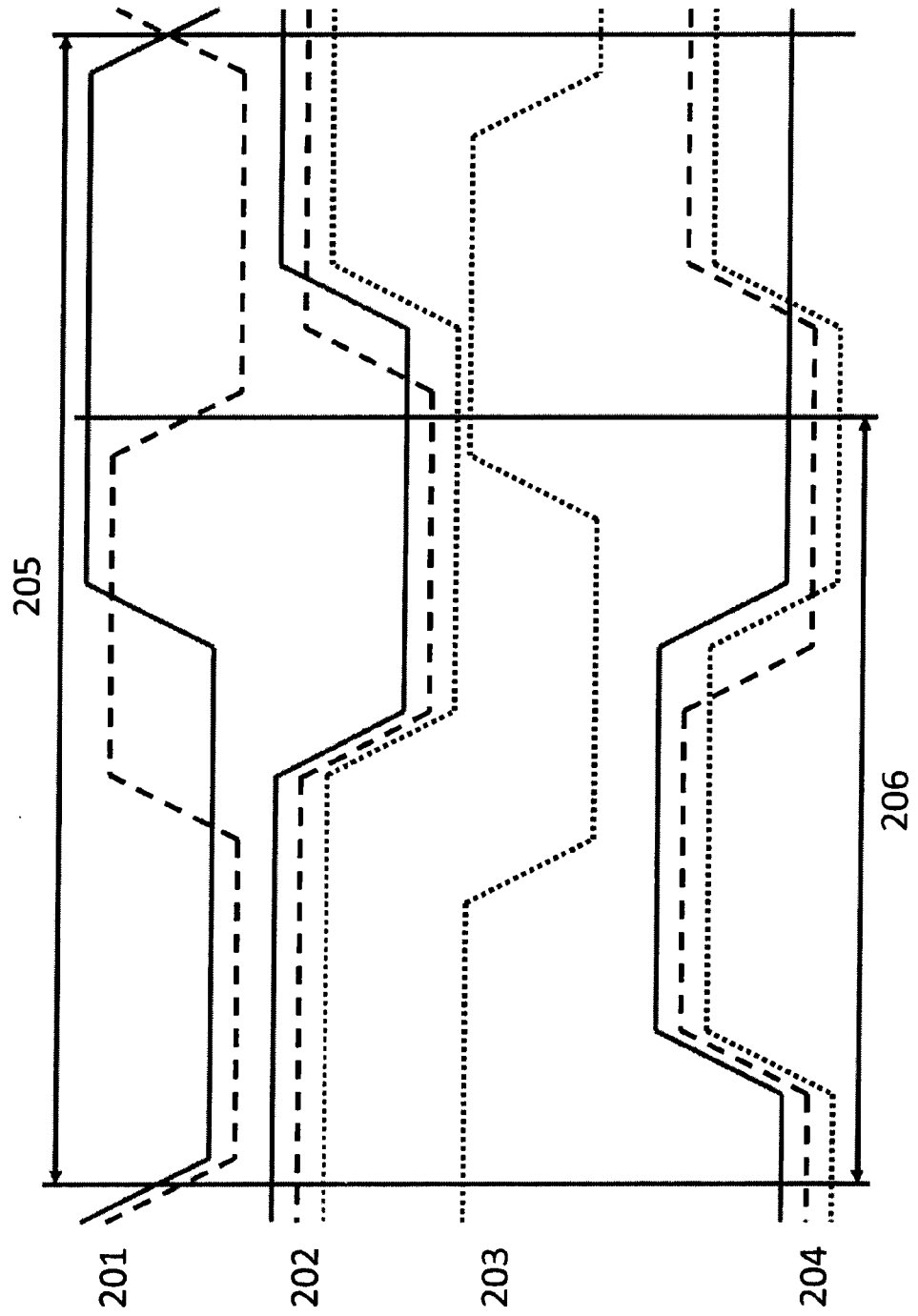
FIG. 2 is a diagram concerning the timing of signals, in accordance with one or more aspects of the present invention.

FIG. 2 may be used to explain the behavior of a chip clock signal 201, first control signal 202, second control signal 203 and local clock signal 204 processed by an electronic circuit 101 according to FIG. 1 in exemplary form.

The chip clock signal 201 may have a longer cycle time 205 or a shorter cycle time 206. The signals referring to the longer cycle time 205 are represented with solid lines and the signals referring to the shorter cycle time 206 are represented in dashed and dotted lines.

Moreover, the solid lines and the dashed lines refer to a situation, in which the second control signal input 108 and the AND-gate 117 are omitted and the chip clock signal in-put 106 is directly connected to the non-inverter input of the NOR-gate 118.

With respect to the signals represented by solid lines, a falling edge of the chip clock signal 201 will lead to a raising edge of the local clock signal 204 after a delay essentially corresponding to the second signal delay. After a further delay essentially corresponding to the pulse width delay the first control signal 202 will change from high to low. Accordingly, the NOR-gate 118 will output a low signal and the local clock signal will change to low essentially after the second signal delay. Hence, the pulse width delay induced by the pulse width control circuitry 104 may essentially determine the pulse width of the local clock signal.

If the cycle time of the chip clock signal 201 becomes shorter (dashed lines), the output of the NOR-gate 118 will change to low before the falling edge of the first control signal arrives at the input of the NOR-gate 118. Accordingly, the pulse width of the local clock signal may no longer be determined by the pulse width control circuitry 104. The pulse width of the local clock signal may no longer be essentially corresponding to the pulse width delay. The pulse width of the local clock signal may, therefore, become erratic and no longer be well-defined. Such a situation may also be called mid cycle race condition.

Referring collectively to FIGS. 1 & 2, the development of the signals for the electronic circuit of FIG. 1 may be described. Due to the chip clock signal input being connected to the AND-gate 106, a raising edge of the chip clock signal 201 will only lead to falling edge at the first clock signal output 109 if the second control signal 108 is also high. Hence, the pulse width of the local clock signal may essentially remain the pulse width delay also for faster cycle times. The chip clock cycle time may be selected to be below 200 ps (picoseconds), in particular, below 120 ps (for example, approximately 100 ps) for the 14 nanometer semiconductor device fabrication node.

The additional AND-gate 107 and second control signal 108 may have limited impact on the overall delay of the electronic circuit 101. In particular, the impact may be less than 10 FO4, more particularly, to less than 2 FO4.

Figure 3:
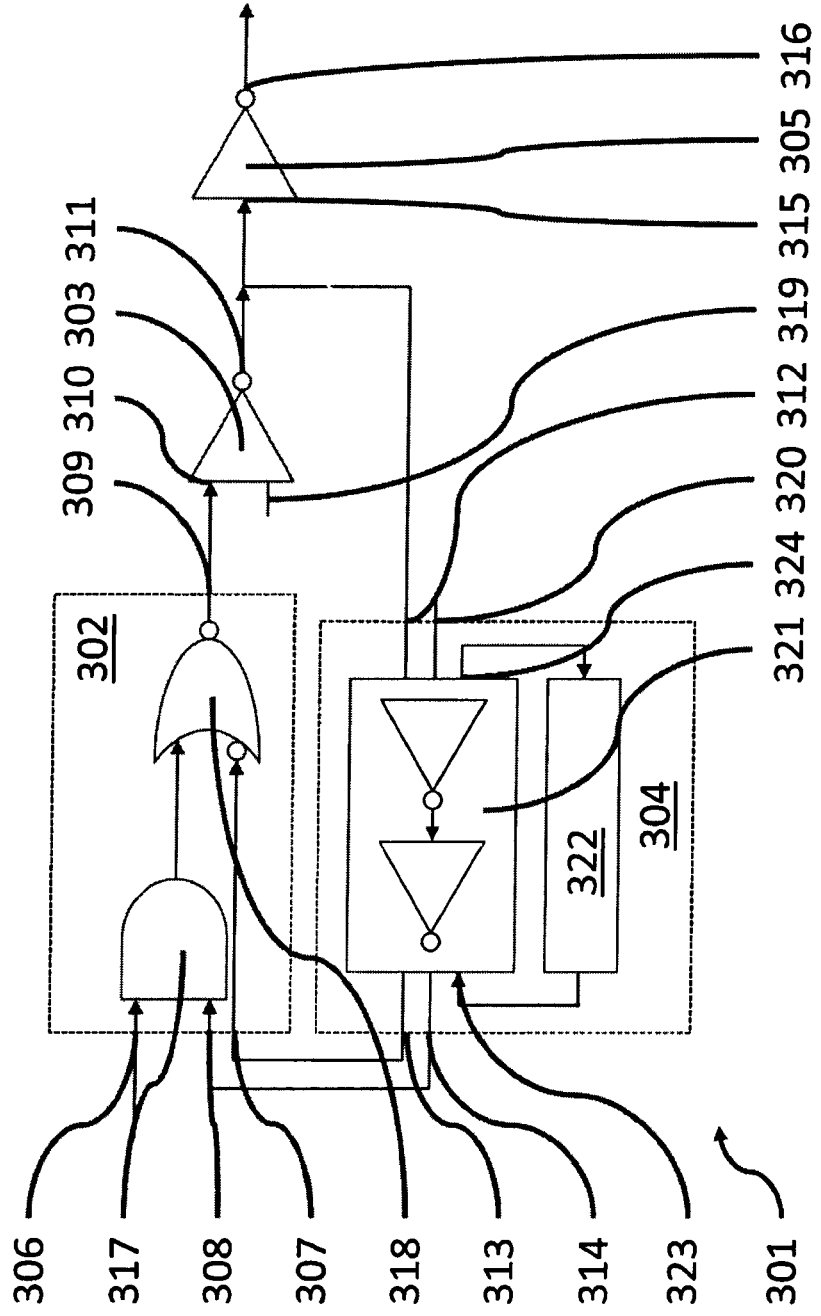
FIG. 3 is a gate-level diagram of another electronic circuit, in accordance with one or more aspects of the present invention.

FIG. 3 discloses a further electronic circuit 301 for use in memory array control circuitry to transform a chip clock signal to a local clock signal in form of a gate level schematic diagram. The electronic circuit 301 includes a base control circuitry 302, delay control circuitry 303, pulse width control circuitry 304 and driver circuitry 305. The base control circuitry 302 has a chip clock signal in-put 306, a first control signal input 307, a second control signal input 308 and a first clock signal output 309. The delay control circuitry 303 comprises a first clock signal input 310 and a second clock signal input 311. The pulse width control circuitry 304 includes a second clock signal input 312, a first control signal output 313 and the driver circuitry 305 comprises a driver second clock signal input 315 and a local clock output 316.

The electronic circuit 301 may receive a chip clock signal via the chip clock signal input 306 of its base control circuitry 302. For example, a phase-locked loop may have generated the chip clock signal. The base control circuitry 302 receives a first control signal via the first control signal input 306 and a second control signal via the second control signal input 307.

A first clock signal is generated by the base control circuitry 302 based on the chip clock signal, the first control signal and the second control signal.

The first clock signal is then transmitted via the first clock signal output 309.

The delay control circuitry 303 receives the first clock signal via its first clock signal input 310 and generates a second clock signal delayed by a second clock delay with respect to the first clock signal. The second clock signal is transmitted via the second clock signal output 311.

The pulse width control circuitry 304 receives the second clock signal via the pulse width control second clock signal input 312. The driver circuitry 305 receives the second clock signal via the driver second clock signal input 315.

The pulse width control circuitry 304 delays the second clock signal by a pulse width delay and transmits the obtained signal as first control signal and second control signal via the first control signal output 313 and the second control signal output 314. The first control signal goes from high to low with a control signal delay after the second control signal goes from high to low and vice versa. In comparison to the second clock delay and the pulse width delay, the control signal delay may be very short. For instance, the control signal delay may be in the range of 0.5 FO4 to 2 FO4.

The base control circuitry 302 may further comprise an AND-gate 317 and a NOR-gate 318. The chip clock signal input 306 and the second control signal input 308 may be connected to the inputs of the AND-gate 317 and the output of the AND-gate 317 may be connected to one input of the NOR-gate 318. The first control signal input 307 may be connected to the inverted other input of the NOR-gate 318.

The delay control circuitry 303 may further comprise a second clock delay input 319 for adjusting the second clock delay. Alternatively or in addition, the pulse width control circuitry 304 may comprise a pulse width delay input 320 for adjusting the pulse width delay. The pulse width control circuitry 304 may be additionally provided with external delay insertion circuitry 322, which is connected to the internal pulse width control circuitry 321 via external delay input 323 and external delay output 324. The external delay insertion circuitry 322 may allow for providing of even wider pulse widths, which may further enhance testing capabilities.

Moreover, the pulse width control circuitry 304 may include a clock chopper off mode, which may allow the pulse width to become half of the cycle time of the chip clock signal.

Figure 4:
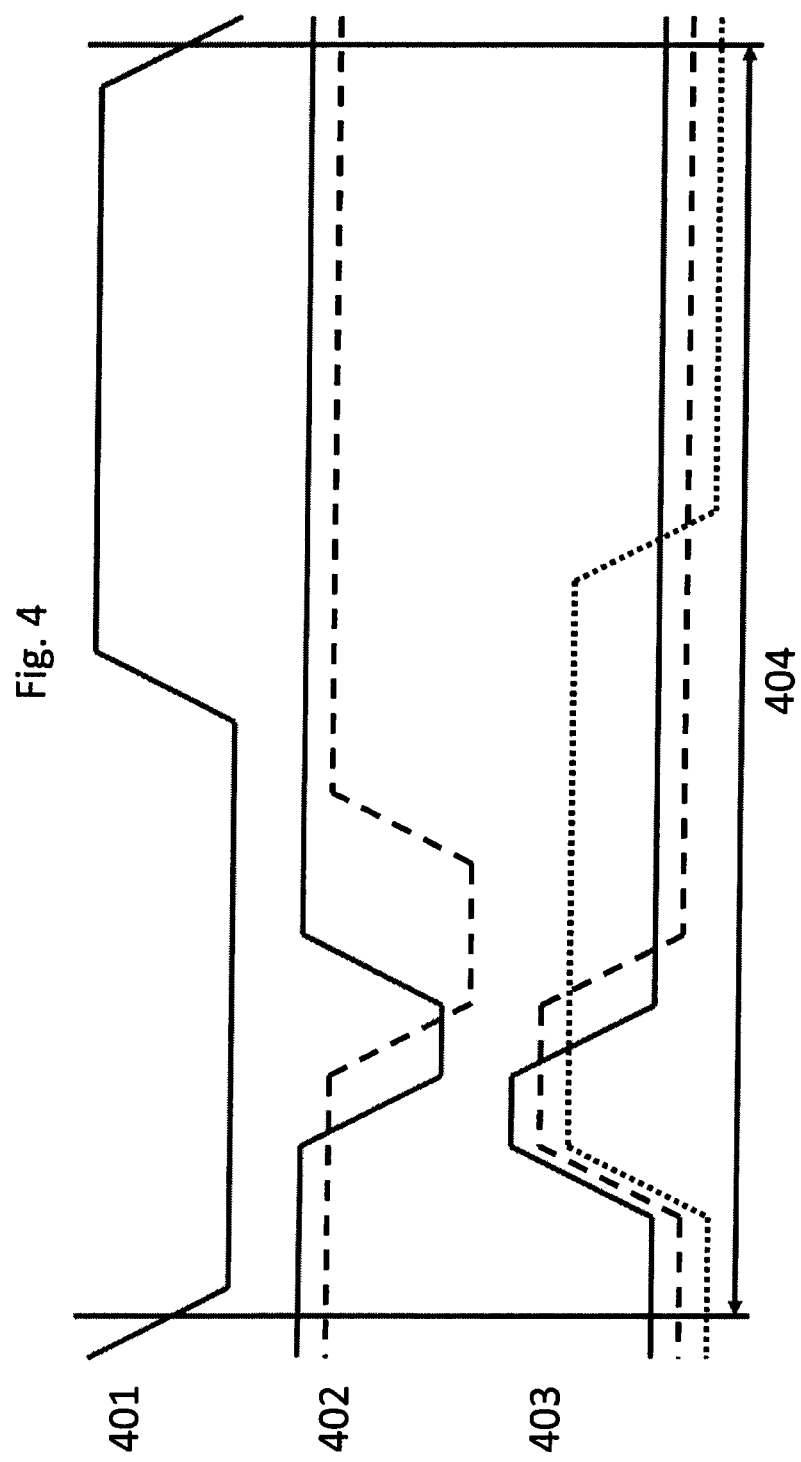
FIG. 4 is a diagram concerning the timing of signals, in accordance with one or more aspects of the present invention.

FIG. 4 shows the development of a local clock signal 403 and of the first control signal 402 in response to a chip clock signal 401. The chip clock signal has a cycle time 404.

The local clock signal 403 depicted with a solid line relates to a situation, where a short pulse width has been selected. In response to the falling edge of the chip clock signal 401, the local clock signal 403 rises. Accordingly, the first control signal 402 falls after a first pulse width delay. The first control signal 402 then forces the local clock signal 403 to fall again, which in turn causes the first control signal 402 to rise again.

The dashed lines show a situation, where a second pulse width delay has been selected, which is longer than the first pulse width delay. Hence, the first control signal 402 will fall later. This will lead to a later fall of the local clock signal 403 and, accordingly, to a later raise of the first control signal. The dotted line shows a situation, where a chopper off mode has been selected. Accordingly, the pulse width of the local clock signal 403 amounts to half of the cycle time of the chip clock signal.

Figure 5:
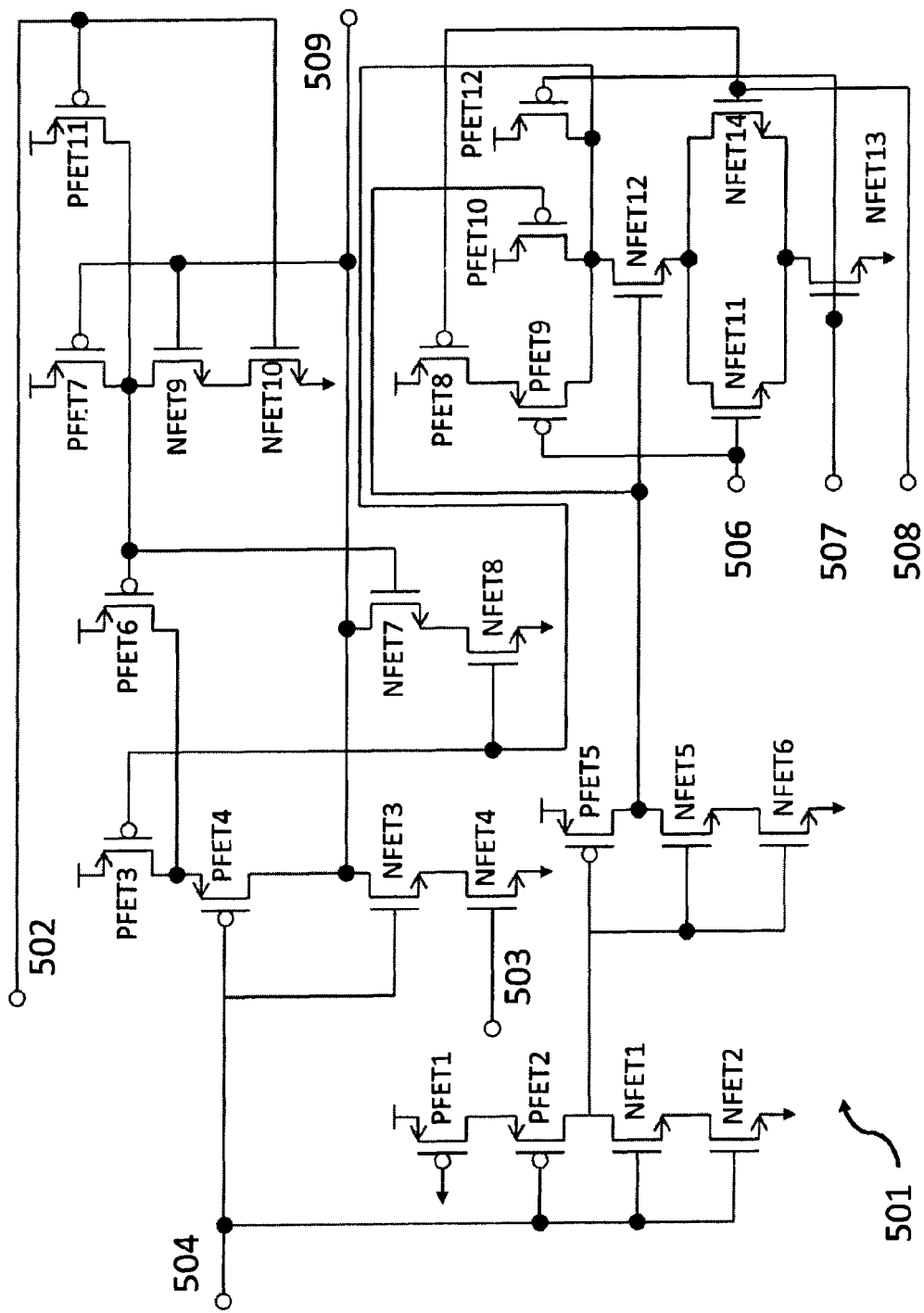
FIG. 5 is a transistor-level diagram of base control circuitry, in accordance with one or more aspects of the present invention.

FIG. 5 shows a transistor level diagram of an exemplary base control circuitry 501. The base control circuitry 501 comprises a first control signal input 502, a second control signal input 503 and a chip clock signal input 504 for receiving a first control signal, a second control signal and a chip clock signal, respectively. In response to these signals, the base control circuitry 501 transmits a first clock signal via its first clock signal output 509.

Further, an activate input 506 may be provided to activate the first clock signal only when activated via an activate signal. Moreover, the base control circuitry 501 may include a force input 507, which allows for overriding the activate input 506 for scan purposes. Finally, provision may be made for a hold input 508. A hold signal applied to the hold input 508 may override the signals received by the activate input 506 and the force input 507.

The signals may be processed by p-type field electric transistors PFET1 to PFET12 and n-type field electric transistors NFET1 to NFET14, which are interconnected as shown in the diagram. The NFET4 may be used as AND-GATE to avoid a mid-cycle race condition as has been explained above. Adding only one further field electric transistor for this purpose may lead to an only negligible power and/or size increase.

Figure 6:
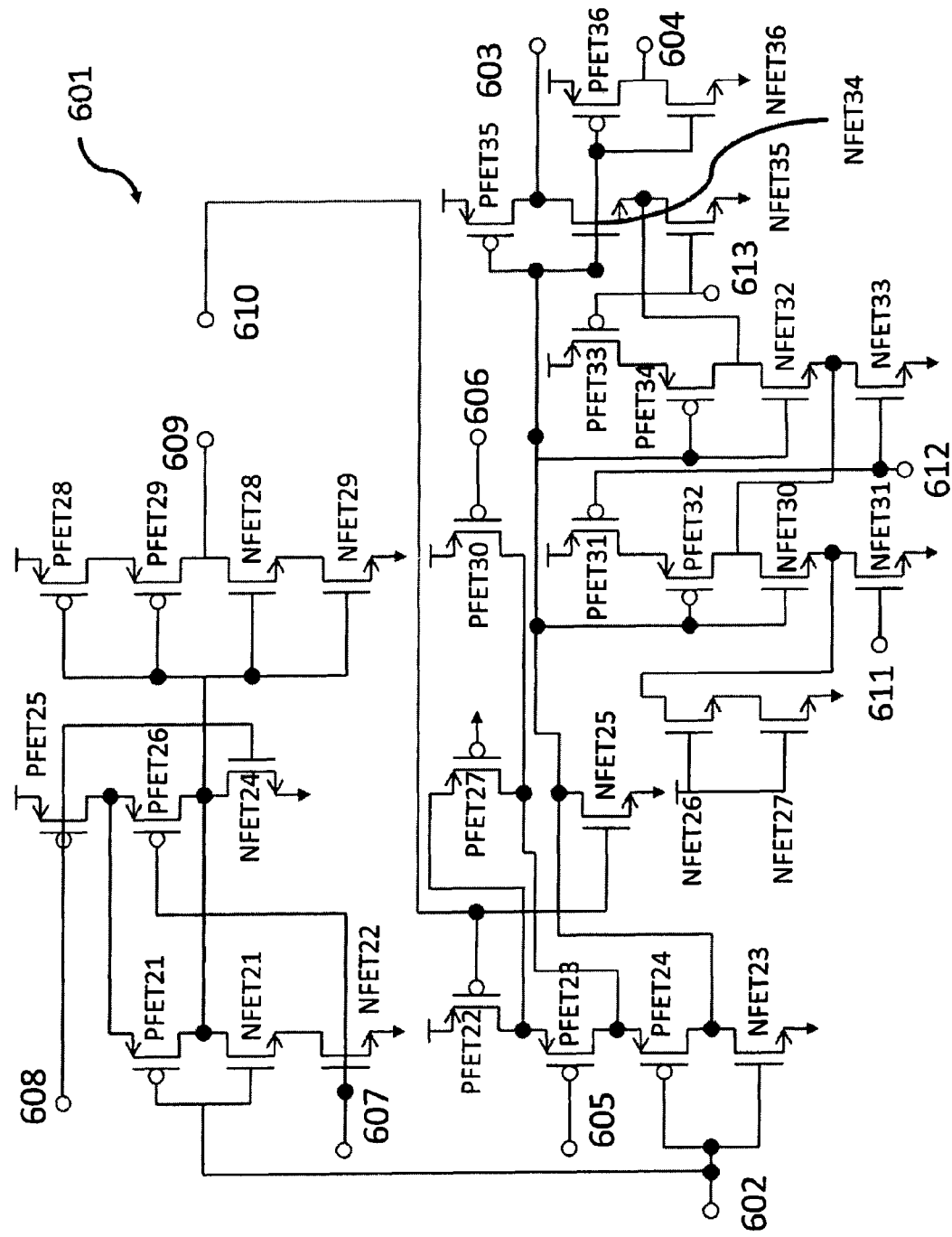
FIG. 6 is a transistor-level diagram of a pulse width control circuitry, in accordance with one or more aspects of the present invention.

FIG. 6 shows a transistor level diagram of an exemplary pulse width control circuitry 601. The pulse width control circuitry 601 comprises a second clock signal input 602, a first control signal input 603 and a second control signal input 604. A first guard band input 605 and a second guard band input 606 are provided for adapting the guard band. A first pulse width input 611, a second pulse width input 612 and a third pulse width input 613 may be used to adjust the length of the pulse width, which is to be induced by the pulse width control circuitry 601. A wide mode input 607 permits selecting for even wider pulse widths.

External delay insertion circuitry may be interconnected via external delay input 610 and external delay output 609. Moreover, the pulse width control circuitry 601 may further comprise a chop off input 608, which may be used to enter a chop off mode. As shown, the signals may be processed by p-type field electric transistors PFET21 to PFET36 and n-type field electric transistors NFET21 to NFET36, which are interconnected as shown in the diagram.

Figure 7:
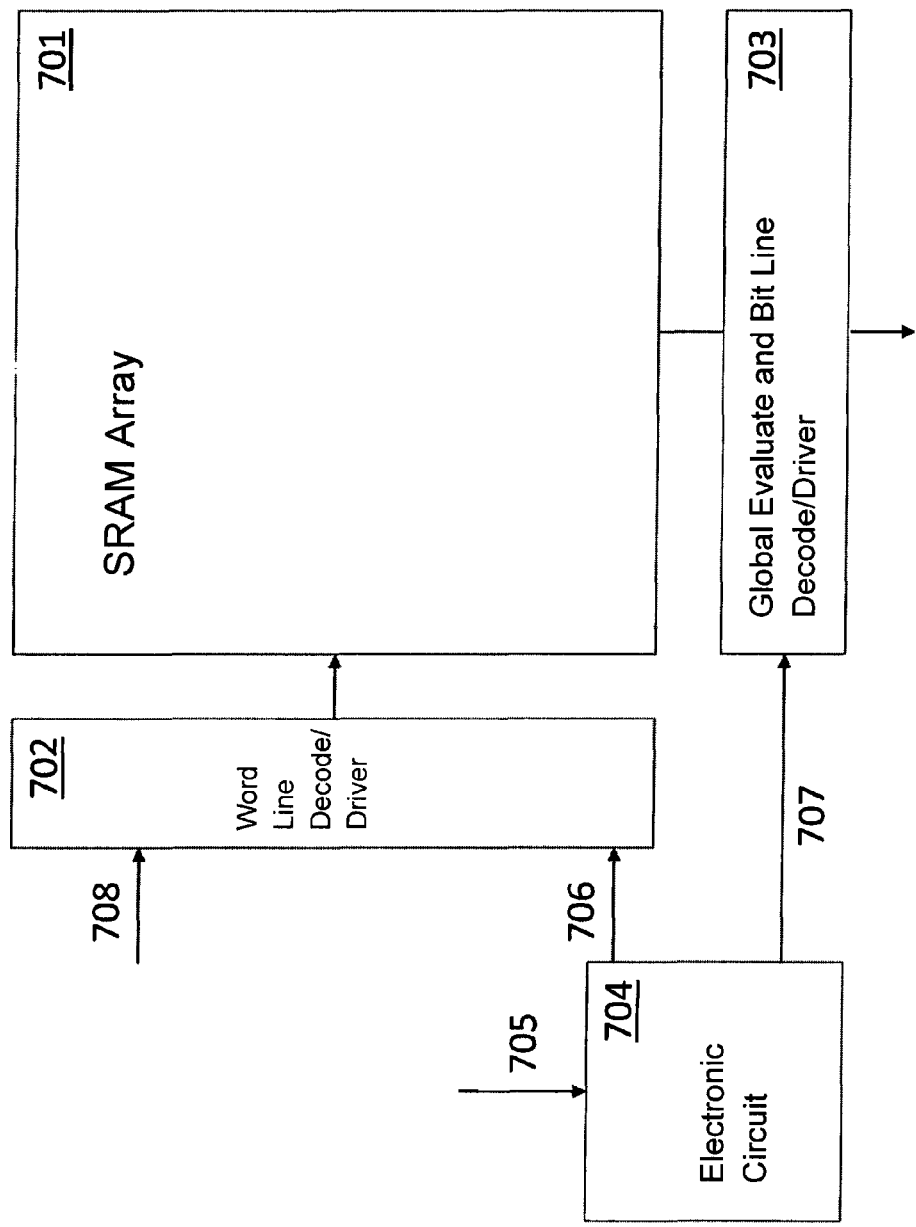
FIG. 7 is a schematic diagram of a memory circuit, in accordance with one or more aspects of the present invention.

FIG. 7 shows an exemplary memory circuit. The memory circuit includes an SRAM array 701, a word line decode/driver 702, a global evaluate and bit line decode/driver 703 and an electronic circuit 704 for transforming a chip clock signal 705 to a first local clock signal 706 and a second local clock signal 707. The word line decode/driver 702 receives the first local clock signal 706 and a word line ad-dress 708 for a requested block of the SRAM array 701, which energizes the corresponding row of memory cells in the SRAM array 701 when the local clock signal 706 is in the active phase. Global evaluate and bit line de-code/driver 703 senses the values in the targeted memory cells and outputs the memory block to the requesting entity (such as a microprocessor) when the second local clock signal 707 is active.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An electronic circuit for use in memory array control circuitry to transform a chip clock signal to a local clock signal, the electronic circuit comprising:
   base control circuitry including:
   a chip clock signal input for receiving the chip clock signal,
   a first control signal input for receiving a first control signal, and
   a second control signal output for transmitting a first clock signal,
   wherein the base control circuitry generates the first clock signal in response to the chip clock signal, the first control signal and the second control signal;
   delay control circuitry including:
   a first clock signal input for receiving the first clock signal, and
   a second clock signal output for transmitting a second clock signal,
   wherein the delay control circuitry generates the second clock signal by delaying the first clock signal with a second clock delay;
   pulse width control circuitry including:
   a pulse width control second clock signal input for receiving the second clock signal,
   a first control signal output for transmitting the first control signal, and
   a second control signal output for transmitting the second control signal,
   wherein the pulse width control circuitry generates the first control signal and the second control signal by delaying the second clock signal with a pulse width delay, wherein the first control signal goes from high-to-low with a control signal delayer after the second control signal goes from high-to-low, and vice versa; and
   driver circuitry including:
   a driver second clock signal input for receiving the second clock signal, and
   a local clock output for outputting the local clock signal,
   wherein the driver circuitry generates the local clock signal based on the second clock signal.

2. The electronic circuit of claim 1, wherein:
   the second control signal input and the chip clock signal input are connected to the inputs of the AND-gate;
   an output of the AND-gate is connected to a first input of the NOR-gate;
   the first control signal input is connected to an inverted second input of the NOR-gate; and
   the output of the NOR-gate is connected to the first clock signal output.

3. The electronic circuit of claim 1, wherein the delate control circuitry further comprises a second clock delay input for adjusting the second clock delay.

4. The electronic circuit of claim 3, wherein the second clock delay is selected from 3 "Fan-out of 4" (FO4) to 6 FO4.

5. The electronic circuit of claim 1, wherein the pulse width control circuitry further comprises a pulse width input for adjusting the pulse width delay.

6. The electronic circuit of claim 5, wherein the pulse width delay is selected from 1 "Fan-out of 4" (FO4) to 15 FO4.

7. The electronic circuit of claim 1, wherein the pulse width circuitry further comprises an external delay insertion circuitry.

8. The electronic circuit of claim 1, wherein the pulse width circuitry further comprises a chop off mode input.

9. A memory circuit comprising:
an SRAM array; and
at least one electronic circuit for transforming a chip clock signal to a local clock signal, wherein the electronic circuit comprises:
base control circuitry including:
a chip clock signal input for receiving the chip clock signal,
a first control signal input for receiving a first control signal,
a second control signal input for receiving a second control signal, and
a first clock signal output for transmitting a first clock signal,
wherein the base control circuitry generates the first clock signal in response to the chip clock signal, the first control signal and the second control signal;
delay control circuitry including:
a first clock signal input for receiving the first clock signal, and
a second clock signal output for transmitting a second clock signal,
wherein the delay control circuitry generates the second clock signal by delaying the first clock signal with a second clock delay;
pulse width control circuitry including:
a pulse width control second clock signal input for receiving the second clock signal,
a first control signal output for transmitting, the first control signal, and
a second control signal output for transmitting the second control signal,
wherein the pulse width control circuitry generates the first control signal and the second control signal by delaying the second clock signal with a pulse width delay, wherein the first control signal goes from high-to-low with a control signal delay after the second control signals goes from high-to-low, and vice versa; and
driver circuitry including:
a driver second clock signal input for receiving the second clock signal, and
a local clock output for outputting the local clock signal,
wherein the driver circuitry generates the lock clock signal based on the second clock signal.

10. The memory circuit of claim 9, wherein:
the base control circuitry comprises an AND-gate and a NOR-gate;
the second control signal input and the chip clock signal input are connected to the inputs of the AND-gate;
an output of the AND-gate is connected to a first input of the NOR-gate;
the first control signal input is connected to an inverted second input of the NOR-gate; and
the output of the NOR-gate is connected to the first clock signal output.

11. The memory circuit of claim 9, wherein the delay control circuitry further comprises a second clock delay input for adjusting the second clock delay.

12. The memory circuit of claim 9, wherein the second clock delay is selected from 3 "Fan-out of 4" (FO4) to 6 FO4.

13. The memory circuit of claim 9, wherein the pulse width control circuitry further comprises a pulse width delay input for adjusting the pulse width delay.

14. The memory circuit of claim 9, wherein the pulse width delay may be selected from 1 "Fan-out of 4" (FO4) to 15 FO4.

15. The memory circuit of claim 9, wherein the pulse width circuitry further comprises an additional delay circuitry.

16. The memory circuit of claim 9, wherein the pulse width circuitry further comprises a chop off mode input.

17. The memory circuit of claim 9, further comprising more than one electronic circuit for transforming a chip clock signal to a local clock signal.

* * * * *